United States Patent [19]
Hurwitt

[11] Patent Number: 5,205,051
[45] Date of Patent: Apr. 27, 1993

[54] METHOD OF PREVENTING CONDENSATION OF AIR BORNE MOISTURE ONTO OBJECTS IN A VESSEL DURING PUMPING THEREOF

[75] Inventor: Steven Hurwitt, Park Ridge, N.J.

[73] Assignee: Materials Research Corporation, Orangeburg, N.Y.

[21] Appl. No.: 714,864

[22] Filed: Jun. 13, 1991

Related U.S. Application Data

[63] Continuation-in-part of Ser. No. 573,845, Aug. 28, 1990.

[51] Int. Cl.$^5$ .............................................. F26B 3/00
[52] U.S. Cl. ........................................ 34/22; 34/15; 34/92
[58] Field of Search .................. 34/22, 23, 29, 32, 15, 34/16, 92, 148

[56] References Cited

U.S. PATENT DOCUMENTS

| | | |
|---|---|---|
| 4,532,970 | 8/1985 | Tullis et al. . |
| 4,544,446 | 10/1985 | Cady . |
| 4,718,975 | 1/1988 | Bowling et al. . |
| 4,816,081 | 3/1989 | Mehta et al. . |
| 4,857,132 | 8/1989 | Fisher . |
| 4,936,940 | 6/1990 | Kawasumi et al. . |
| 4,943,457 | 7/1990 | Davis et al. . |
| 4,966,669 | 10/1990 | Sadamori et al. . |

FOREIGN PATENT DOCUMENTS

| | | |
|---|---|---|
| 0067705 | 12/1982 | European Pat. Off. . |
| 0136562 | 9/1983 | European Pat. Off. . |
| 60-96755 | 5/1985 | Japan . |
| 2-163377 | 6/1990 | Japan . |

OTHER PUBLICATIONS

Balder and Cachon, I.B.M. Technical Disclosure, Diverter Flow Bernoulli Pick Up Device Oct. 1979.

*Primary Examiner*—Henry A. Bennett
*Attorney, Agent, or Firm*—Wood, Herron & Evans

[57] ABSTRACT

A pressure sealed chamber such as a load lock for a apparatus for processing substrates is operated with a guide plate spaced from a substrate supported therein so as to form a gap which covers the substrate surface to be protected from contamination by moisture condensing in the chamber during the rapid evacuation thereof. During the evacuation of the chamber, by either pumping or venting, clean dry gas is introduced through an orifice in the center of the plate so as to flow outwardly from the edge of the gap at a pressure sufficient to displace or otherwise prevent gas borne moisture condensate in the chamber from entering the gap and contaminating the surface to be protected of the substrate. During the evacuation of the chamber, gas is introduced through the gap at a flow rate less that of the evacuating gas.

8 Claims, 1 Drawing Sheet

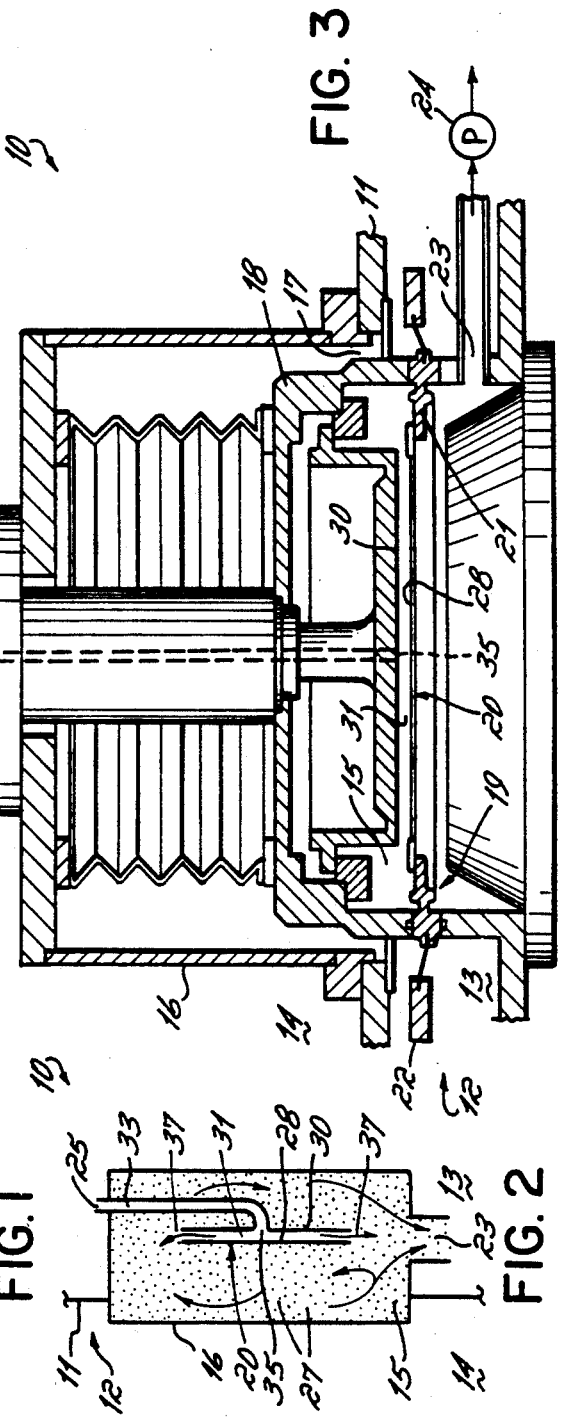
FIG. 3
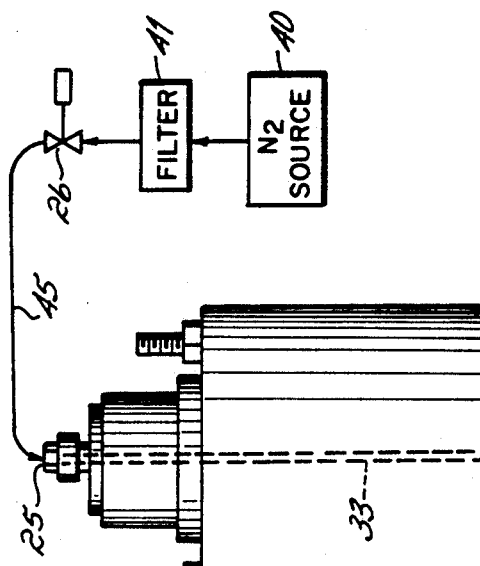
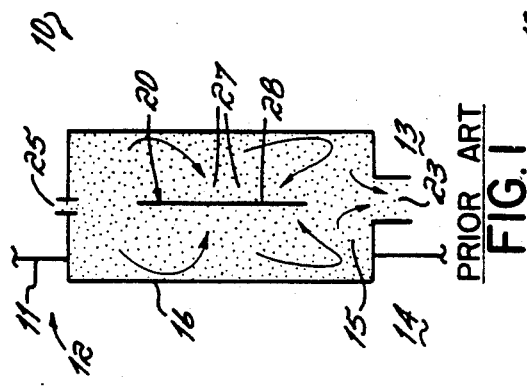
PRIOR ART
FIG. 1
FIG. 2

METHOD OF PREVENTING CONDENSATION OF AIR BORNE MOISTURE ONTO OBJECTS IN A VESSEL DURING PUMPING THEREOF

This application is a continuation-in-part of U.S. patent application Ser. No. 07/573,845, filed Aug. 28, 1990 entitled "Method and Apparatus for Reducing Particulate Contamination," hereby expressly incorporated herein by reference.

FIELD OF THE INVENTION

The present invention relates to pressure sealed chambers and, more particularly, to the reduction of the contamination of objects in chambers of processing machines by condensation caused by pressure reduction during the evacuation of moisture laden gas from the chambers.

BACKGROUND OF THE INVENTION

In the manufacture of semiconductor devices and other articles through coating or etching processes performed on wafers and other substrates, it is imperative that the contamination of the substrate surfaces to be processed be minimized. Surfaces to be protected from such contamination include, for example, the device surfaces of semiconductor wafers. The device surfaces are the surfaces of the wafers on which layers of conductive, insulative or other material are coated or etched by sputtering or other processes to form the manufactured devices. In such processes, the presence of microscopic contaminants on the device surface of a wafer may render an entire device functionally defective by adversely affecting the application or removal of a component layer at a critical point on the wafer surface.

Similarly, magnetic disks, optical disks, lenses, magneto-optical disks and other such objects may be substantially reduced in value or quality by contaminants present on the surface during processing. In the manufacture of large scale integrated circuits, a large quantity of semiconductor devices is formed of a single wafer. In the processing of such wafers, the contaminants present on the device surface of a wafer during processing can significantly reduce the number of such devices of acceptable quality produced from the wafer.

In a semiconductor processing apparatus such as a typical sputter coating or sputter etching machine, a wafer substrate is processed in an isolated and usually near vacuum environment. Such machines have a vacuum chamber in which the processing operations are carried out. The vacuum chamber is usually provided with one or more chamber doors located in the wall of the chamber through which wafers being processed are introduced and removed. On the outside of this chamber, the wafers are moved by some wafer handling mechanism between a cassette or carrier and the chamber door. A transfer mechanism, which is usually included in the external wafer handling mechanism, introduces the wafers into and removes them from the vacuum chamber through the chamber door opening. In the vacuum chamber, the wafer is usually received and held by a holder that supports the wafer during processing.

During the entry and removal of the wafers from the vacuum chamber, the portion of the chamber into which the wafers are placed and from which the wafer is removed will necessarily be at the same pressure and of the same atmospheric environment as exists in the external environment outside the chamber door. Such external environment will almost always contain air or some other gas containing some amount of water vapor. During processing, however, the portion of the chamber in which the wafer is to be processed must be brought to the vacuum pressure and atmospheric content as the process requires. This change of atmospheres necessitates a repetitive opening and isolation of the internal and external environments and the alternate pumping and venting o at least a portion of the vacuum chamber.

Wafer processing machines that process wafers in a vacuum environment most often maintain a constant vacuum environment so that processing upon some wafers can be carried out as others are being inserted into or removed from the chamber. To this end, such machines have an intermediate chamber or load lock at the entry to the processing chamber that alternately communicates with the external environment through the open chamber door, and, when the door is sealed, with the internal environment of the processing chamber through a sealable entry thereto. Such a load lock is alternately pumped to the vacuum level of the internal environment of the main processing chamber and vented to the external environment so that the pressure of the load lock matches that of environment with which it communicates during the introduction into and removal from the processing chamber of the wafers. With such a load lock, the internal portion of the chamber where processes are carried out may be maintained continuously at the pressure and composition of the vacuum environment and may be used additionally for the processing of other wafers while wafers are being introduced into and removed from the load lock chamber.

Other types of processing machine, such as batch processing machines may have no load lock, but are instead opened to the external environment and loaded with the objects to be processed. In such machines, the entire processing chamber is repeatedly pumped and vented.

After a chamber is loaded and sealed, it is necessary to pump the chamber to a near vacuum level. To maintain high productivity, the atmosphere should be pumped from the chamber as rapidly as possible. This pumping, when it is done rapidly, often causes moisture contained in the air within the chamber to momentarily condense, forming a temporary fog in the chamber. This condensate can precipitate onto the surface to be processed of the object within the chamber. This moisture, when it evaporates from the object surface, often leaves a microscopic residue. This residue can contaminate the surface to be processed, which can cause defective processing of the object to occur.

Accordingly, there is a need to reduce the contamination by condensation of water vapor of semiconductor wafer disks, and other objects in load locks and other pressure chambers of processing machines when rapid pumping of the chamber containing the object to a near vacuum level is occurring.

SUMMARY OF THE INVENTION

It is a primary objective of the present invention to prevent the contamination of the critical surfaces of wafers and other objects in load locks and other pressure chambers from vapor which condenses during the pumping of a load lock or other pressure chamber.

According to the principles of the present invention, clean and exceptionally dry gas is introduced into a chamber, during the evacuation of the chamber, in such a way as to form a pressurized layer of the clean dry gas adjacent at least one surface to be protected of a object supported in the chamber. The pressurized layer of clean dry gas pneumatically shields the surface of the object from contamination by condensed moisture borne by the gas within the chamber should any vapor condense during the evacuation of the chamber.

According to the preferred embodiment of the present invention, a shield or guide plate is maintained in close spaced, generally parallel, relationship with the object surface to be protected, at for example the frontplane of a semiconductor wafer supported in the chamber. The plate covers the entire device surface of the wafer to be processed, and in combination with the wafer device surface forms a gap between the plate and the surface to be protected adjacent the surface. Through an orifice in this plate, the clean dry gas such as nitrogen or argon is introduced during the evacuation of the chamber. The pressure of the gas at the orifice is such as to maintain a positive pressure, with respect to the chamber environment, at the periphery of the gap around the edge of the surface being protected s that o the clean dry gas flows from the orifice radially outwardly through the gap periphery, thereby preventing, or at least inhibiting, moisture which condenses within the chamber during the rapid pumping of the chamber from entering the gap and precipitating onto the protected surface. Viewed differently, the outward flow of gas from the gap periphery deflects the flow of gas-borne vapor, preventing the moisture from entering the gap from the chamber and depositing onto the surface to be protected of the object in the chamber.

In accordance with a preferred embodiment of the invention, evacuation of a chamber is achieved by pumping gas from the chamber while simultaneously introducing clean dry gas through the plate and into the gap adjacent the surface to be protected of the object. The gas introduced during the evacuation of the chamber is introduced at a flow rate sufficient to pressurize the gap between the plate and the surface to be protected at a level greater than that in the chamber. The introduction of such vent gas during the chamber pumping process is at a rate which is nonetheless small with respect to the pumping flow rate.

While the preferred embodiments of the invention are described herein for use with machines in which the processes are carried out in a vacuum or negative pressure environment, certain of the principles described herein are applicable whenever there is a rapid evacuation of the chamber and rapid pressure reduction, or where there is otherwise a tendency for moisture to condense within such a chamber. The specific problems solved and advantages realized by the invention are particularly applicable to vacuum processes, however, especially to sputter processing operations.

Furthermore, while the preferred embodiments of the invention are described in machines for coating or etching semiconductor wafers, the principles of the invention are applicable to machines and processes wherein other objects such as lenses, or magnetic, optical or magneto-optical disks are coated, etched or otherwise processed in chambers in which moisture laden gas may be rapidly removed by pumping or venting of a chamber. With the present invention, various substrate surfaces, including but not limited to the device surfaces of semiconductor wafers, are protected from contamination by condensation. The protection is important in chambers such as load-lock chambers which are pumped and vented regularly causing pressure changes to occur which cause vapor to condense within the chamber. Other chambers such as reactive gas etching and sputter coating chambers are also pumped and vented, and will benefit from the present invention.

These and other objectives and advantages of the present invention will be more readily apparent from the following detailed description of the drawings in which:

BRIEF DESCRIPTION OF THE DRAWINGS

FIG. 1 represents devices of the prior art.

FIG. 2 is a diagram illustrating the evacuation of a load lock chamber or other such chamber of a vacuum processing apparatus operated in accordance with principles of the present invention.

FIG. 3 is a cross-sectional view illustrating the load lock chamber represented in the diagrams of FIG. 2.

DETAILED DESCRIPTION OF THE DRAWINGS

A load lock or other chamber operated according to one preferred embodiment of the present invention is particularly suitable for use in combination with a wafer processing apparatus such as the sputter coating and sputter etching apparatus disclosed in the commonly assigned U.S. Pat. Nos. 4,909,695 and 4,915,564, both entitled "Method and Apparatus for Handling and Processing Wafer-Like Materials," hereby expressly incorporated herein by reference.

These above incorporated patents describe, in pertinent part, a method and apparatus for processing wafers, particularly for the sputter coating and etching of semiconductor wafers, in the vacuum environment maintained within a main chamber of the 0 machine. In the apparatus described in the above incorporated patents, wafers may be simultaneously and sequentially processed at a plurality of processing stations in the main vacuum processing chamber. In the main chamber, the wafers are held in a rotatable plate which indexes them in a circle among a plurality of angularly spaced stations, including a plurality of processing stations and a single load lock station at which is situated a load lock through which wafers are transported into and out of the main processing chamber and to and from an external environment. The load lock is sealable both from the main chamber and the external environment of the machine.

These above incorporated patents also disclose a mechanism for transporting unprocessed semiconductor wafers from the external environment and into a holder within the load lock, and removing processed wafers from the load lock to the external environment. These patents explain in detail the operation of the wafer handling mechanism, the structure and operation of the load lock, the structure and operation of the mechanism for moving a wafer supported in holder a between the load lock and stations within the main processing chamber, and the structure for isolating the load lock from the main processing chamber.

FIG. 1 represents devices of the prior art and other devices which are constructed and operated without the features of the present invention. FIG. 2 represents such a load lock incorporating the features of, and operated in accordance with, the present invention. FIG. 3 illustrates a load lock having the features of the load lock of FIG. 1, and, in addition, having the structure of the load lock of FIG. 2, which functions in accordance with the present invention.

As illustrated in FIG. 3, a load lock 10 is provided in a wall 11 of a wafer processing apparatus 12. The wall 11 encloses an internal main processing vacuum chamber 13 which is preferably maintained continuously at an internal vacuum pressure level and which usually contains a gas other than air. In a sputter processing apparatus, for example, where the gas in the internal environment 13 is to be ionized in the course of a coating or etching process, the gas may be typically an inert gas such as argon. An external environment 14, which is usually air at atmospheric pressure, surrounds the apparatus 12 and lies outside of the main chamber wall 11 of the apparatus 12. This external environment will invariably contain at least some moisture.

The load lock 10 encloses an intermediate transfer or load lock chamber 15 between the internal environment 13 and the external environment 14. The load lock 10 has, located on the side thereof toward the external environment 14, a load lock door 16 which, when open, permits passage of the articles to be processed between the load lock chamber 15 and the external environment 14. The door 16 sealably closes to isolate the external environment 14 from the environment within the load lock chamber 15. The load lock 10 is also provided with a closable entry 17 through which wafers or other substrate articles are moved between the load lock chamber 15 and the internal environment 13 of the main chamber where they are processed. The entry 17 is illustrated as sealed in FIG. 3 between a movable chamber section 18 which clamps a wafer holder support and sealing ring 19 against the wall 11 around the chamber door 16.

An article such as a semiconductor wafer 20 is supported in the load lock chamber 15 in a holder 21 carried by the ring 19. The ring 19 is in turn resiliently mounted on a rotatable index plate 22 which is in the main chamber 13. The chamber section 18 is retractable away from the wall 11 so as to open the entry 17 between the load lock chamber 15 and the main chamber 13 to allow the wafer 20 in the holder 21 to be moved edgewise between the load lock chamber 15 and a processing station within the main chamber 13 as the plate 22 rotates.

The load lock 10 is provided with an exhaust port 23 to which is connected a vacuum pump 24 for pumping the load lock chamber 15 to the vacuum pressure level of the internal environment of the main chamber 13. The load lock 10 is also provided with a vent port 25 for venting or refilling the load lock chamber 15 so as to restore the pressure within the load lock chamber to that of the external atmosphere 14.

An unprocessed wafer 20 is introduced from the external atmosphere 14 into the internal environment of the main chamber 13 through the opened load lock door 16 while the entry or passage 17 between the load lock chamber 15 and the main chamber 13 is sealed. A processed wafer 20 is transferred through the open door 16 between the load lock chamber 15 of the load lock 10 and the external environment 14. The transfer of the wafer 20 between the external environment 14 and the load lock chamber 15, including the method and the mechanism for so transferring the wafers, is disclosed in the commonly assigned U.S. Pat. No. 4,915,564 incorporated by reference above.

When the wafer is with the environment 15 of the chamber 10 and the chamber door 16 is closed, sealing the internal environment 15 from the external environment 14, the load lock chamber 15 is pumped to the same pressure level as the internal environment of the main chamber 13. The pump 24 evacuates the load lock chamber 10 through the exhaust port 23. The pumping of the load lock chamber 10 may also be accompanied by the injection of replacement gas through the vent port 25 of the load lock chamber 10 so that the near vacuum pressure level ultimately achieved in the load lock chamber 10 is the same gas composition as that of the internal environment 13.

The pumping of the chamber 15 is accomplished as rapidly as possible in order to maximize the productive use of the machine. The rapid pumping and resulting rapid drop in the pressure within the chamber 15 often results in a momentary condensation of the air borne water vapor carried by the gas from the external environment 14 which initially filled the chamber. This condensation poses a problem to which the present invention is directed, as set forth more fully below.

Once the load lock 1 has been pumped and the environment of the load lock chamber 15 is at the pressure level of the main chamber environment 13, the load lock 10 is opened to the internal environment of the main chamber 13 and the wafers 20 are moved to the main chamber 13, where they step through a plurality of processing stations within the main chamber 13 for processing. A sputter processing apparatus and the method of transferring the wafers 20 from the load lock throughout the main chamber 13 are described in the commonly assigned U.S. Pat. No. 4,909,695 incorporated above by reference.

The transfer of wafers from the main chamber 13 to the external environment 14 need not take place through the same load lock as the passage of wafers from the external environment 14 to the main chamber 13. Preferably, however, a single load lock 10 is used for the transfer of wafers in both directions, with processed and unprocessed wafers being exchanged in the load lock. For purposes of describing the present invention, a single load lock is therefore described for both purposes.

For transfer of a wafer 20 from the main chamber 13 to the external environment 14, the load lock 10 is opened to the main chamber 13 so that the wafer 20 moves from the main chamber 13 to the load lock chamber 15 through the entry 17. In the preferred apparatus 12 described in the patents incorporated above, a processed wafer is transferred from the main chamber 13 to the load lock chamber 15 simultaneously with the transfer of an unprocessed wafer from the load lock chamber 15 to the main chamber 13 as the plate 22 rotates, thereby exchanging one wafer 20, ring 19 and holder 21 with another in the load lock chamber 15.

When a processed wafer 20 is positioned in the load lock 10 for transfer to the external environment 14, and the load lock chamber environment 15 is isolated from that of the main chamber 13, vent gas is released through a valve 26 into the chamber 15 to allow the pressure within the chamber 15 to rise to that of the external environment 14. Once the pressures have been equalized in the chamber 15 with respect to the external environment 14, the load lock door 16 is opened and the wafer 20 is removed from the load lock 10.

Referring to FIG. 1, the environment within the chamber 15 is shown immediately following the rapid pressure drop caused by the pumping of the chamber 15. As this pressure drop occurs, a cloud of moisture droplets, or fog, 27, which has a tendency to form in the chamber 15 of the load lock 10, is illustrated as it would be found in load lock chambers of the prior art. The wafer 20, for example, in the chamber 15 has a device surface 28 on one side thereof on which are to be formed a number of semiconductor devices. The fog 27, when allowed to precipitate onto the device surface 28 of the wafer 20, can cause defects in devices to be formed during processing. The moisture which condenses on the surface 28 carries with it solids or dissolved substances, which, when the moisture ultimately evaporates, remains on the surface 28 as a contaminant, which inhibits the proper processing of the surface 28. This is particularly a problem upon entry of the wafers into the main chamber 13, as illustrated in FIG. 1.

In the prior art, whether by venting of the load lock chamber 15 or by the pumping of the load lock chamber, a rapid pressure drop can cause a condensation of vapor within the internal environment 15 of the chamber 10. The condensation produces a fog 2 in the internal volume of the chamber 15 within the load lock 10. The gas borne water droplets alight upon the device surface 28 of the wafer 20, and are capable of damaging the semiconductor devices to be formed thereon.

Referring to FIGS. 2-3, according to the principles of the present invention, the load lock chamber 10 is provided with a guide or plate 30 which is closely spaced adjacent, and substantially parallel, to the device surface 28 of the wafer 20 so as to form a gap 31 therebetween which covers the device surface 28 of the wafer 20 The plate 30 is preferably circular and at least as large as the device surface 28 of the wafer 20. Since plate 30 is generally planar and parallel to the wafer device surface 28, the gap formed therewith is of uniform thickness. This gap thickness is preferably in the range from 0.05 to 0.50 inches, with a spacing of approximately 0.1 inches preferred. The plate 30 may also be a surface of another structure similarly positioned such as a front-plane heater, where one is provided. With the preferred embodiment of the present invention, however, a vent line 33 is connected between the vent inlet port 25 and an orifice 35 in the guide plate 30 over the device surface 28. Preferably, the orifice 35 is centrally located on the plate 30, to communicate some or all of the vent gas from the inlet 25 to the gap 31, particularly during the pumping of the load lock chamber 10 to the desired vacuum.

According to the preferred embodiment of the invention, a vent gas, such as dry nitrogen or argon, is introduced into the lock lock chamber 15 at a pressure of 1 to 3 psi more than that of the load lock chamber 15 through the duct 33 and centrally into, and radially outwardly from, the gap 31 during the process of pumping the load lock to a vacuum. The pumping will usually be at such a rate as to initially bring the load lock chamber 15 from atmospheric pressure to a significant vacuum level in about ten seconds. Since the load lock chamber is about 1.5 liters in volume, the average initial flow rate for pumping the chamber is about 9 liters per minute. The introduced vent gas is ultra dry, typically of less than ten parts per million moisture content. At such a level, no moisture will condense from the vent gas, which is the only gas that will be in contact with the surface of the wafer to be protected.

At all times that gases are flowing to or from the load lock chamber 10, a flow of clean vent gas is maintained in a direction radially outwardly away from the gap 31 around the full perimeter of the device surface 28 of the wafer 20. This is shown by the arrows 37. This outward flow of gas is maintained in an outward direction around the perimeter of the device surface 28 by maintaining the pressure of the clean dry gas at the orifice 35 sufficiently in excess of the pressure in the chamber 15 around the edge of the gap 31. In this manner, droplets 27 which are formed in the load lock chamber 15 are still carried by the moving gas, but are instead deflected or otherwise prevented from contacting the device surface 28 or entering the gap 31 by the radially outwardly flow of clean vent gas as shown by arrows 37. The vent gas entering the inlet port of vent 25 may be typically, for example, nitrogen gas from a source 40 which is passed through a filter 41, preferably a .02 micrometer filter to remove particulates therefrom, then through the valve 26 which is a clean valve, preferably a bellows type, which controls the flow of the gas from the source 40 into an electropolished no bend gas line 45 which communicates with the inlet port 25 to the load lock chamber 10.

It will be appreciated that, while specific embodiments nd applications of the present invention have been illustrated and described, variations thereof may be made without departing from the principles of the present invention.

Accordingly, the following is claimed:

1. A method of preventing contamination of a surface to be coated of a substrate supported in a processing chamber while evacuating a chamber to a predetermined lower pressure level comprising the steps of:

supporting in a chamber a substrate having a surface thereon to be protected from contamination by moisture condensing in the chamber;

forming a gap adjacent to and covering the surface to be protected, the gap having a periphery encircling the surface to be protected;

removing gas from the chamber at a predetermined flow rate to lower the pressure thereof and until the chamber has reached the vacuum pressure level, the pumping being at a rate sufficiently rapid to cause moisture contained in the gas within the chamber to condense within the chamber;

introducing a clean dry gas into the gap, while pumping gas from the chamber to lower the pressure thereof, and at a flow rate less than the predetermined flow rate; and guiding the introduced clean dry gas, while it is being introduced, along the surface to be protected and through the gap so as to flow outwardly at the periphery of the gap into the chamber, the clean dry gas having a moisture content sufficiently low to avoid condensation in the gap while the clean dry gas is flowing therethrough.

2. The method of claim 1 further comprising the step of:

the introducing step includes the step of introducing the gas at a pressure sufficient to produce a pressure around the periphery of the gap that exceeds the pressure of the chamber, thereby maintaining the flow of clean dry gas outwardly from the gap periphery.

3. The method of claim 1 wherein:

the clean gas is introduced into the gap by way of a centrally disposed opening in the plate to establish the gas flow in the gap radially outwardly in all directions.

4. A method of pumping gas from a chamber to lower the pressure in the chamber to a vacuum pressure level, the method comprising the steps of:
   supporting in a chamber a substrate having a surface thereon to be protected from contamination by moisture condensing in the chamber;
   forming a gap adjacent to and covering the surface to be protected, the gap having a periphery encircling the surface to be protected;
   pumping gas from the chamber at a predetermined flow rate to lower the pressure thereof and until the chamber has reached the vacuum pressure level, the pumping being at a rate sufficiently rapid to cause moisture contained in the gas within the chamber to condense within the chamber;
   introducing a clean dry gas into the gap, while pumping gas from the chamber to lower the pressure thereof, and at a flow rate less than the predetermined flow rate; and
   guiding the introduced clean dry gas, while it is being introduced, along the surface to be protected and through the gap so as to flow outwardly at the periphery of the gap into the chamber, the clean dry gas having a moisture content sufficiently low to avoid condensation in the gap while the clean dry gas is flowing therethrough.

5. The method of claim 4 wherein:
   the guiding step includes the step of guiding the introduced gas with a plate positioned adjacent the surface to be protected.

6. The method of claim 5 wherein:
   the introducing step includes the step of introducing the clean dry gas through an orifice in the plate.

7. The method of claim 6 wherein:
   the introducing step includes the step of introducing the gas at a pressure sufficient to produce a pressure around the periphery of the gap that exceeds the pressure of the chamber, thereby maintaining the flow of clean dry gas outwardly from the gap periphery.

8. The method of claim 4 wherein:
   the clean dry gas is introduced into the gap by way of a centrally disposed opening in the plate to establish the gas flow in the gap radially outwardly in all directions.

* * * * *